(12) United States Patent
Cazes et al.

(10) Patent No.: US 12,345,583 B2
(45) Date of Patent: Jul. 1, 2025

(54) CONTROL UNIT FOR A MOTOR VEHICLE

(71) Applicants: NOVARES FRANCE, Clamart (FR); NANOMADE LAB, Toulouse (FR)

(72) Inventors: Christophe Cazes, Versailles (FR); François Lelievre, Anthony (FR); Fabrice Severac, Toulouse (FR); Nicolas Dufour, Vallegue (FR)

(73) Assignees: NOVARES FRANCE, Clamart (FR); NANOMADE LAB, Toulouse (FR)

( * ) Notice: Subject to any disclaimer, the term of this patent is extended or adjusted under 35 U.S.C. 154(b) by 372 days.

(21) Appl. No.: 17/904,987

(22) PCT Filed: Feb. 24, 2021

(86) PCT No.: PCT/FR2021/050324
§ 371 (c)(1),
(2) Date: Aug. 25, 2022

(87) PCT Pub. No.: WO2021/170957
PCT Pub. Date: Sep. 2, 2021

(65) Prior Publication Data
US 2023/0021208 A1    Jan. 19, 2023

(30) Foreign Application Priority Data

Feb. 28, 2020 (FR) ...................... 2002055

(51) Int. Cl.
*B60K 35/00* (2024.01)
*B60K 35/10* (2024.01)
(Continued)

(52) U.S. Cl.
CPC ............ *G01L 1/2293* (2013.01); *B60K 35/00* (2013.01); *G01D 5/24* (2013.01); *G06F 3/016* (2013.01);
(Continued)

(58) Field of Classification Search
None
See application file for complete search history.

(56) References Cited

U.S. PATENT DOCUMENTS

2012/0327025 A1    12/2012  Huska et al.
2015/0268692 A1*    9/2015  Viallet .................... G06F 3/041
                                                              345/174
(Continued)

FOREIGN PATENT DOCUMENTS

CN      104729546 A     6/2015
CN      107491201 A    12/2017
(Continued)

OTHER PUBLICATIONS

Anonymous; "Unflattening Touch Screen Buttons | SciTe Daily", Nov. 24, 2009, pp. 1-8, From the Internet: URL:https://scitedaily.wordpress.com/2009/11/24/unflattening-the-touchscreen/.
(Continued)

*Primary Examiner* — Curtis A Kuntz
*Assistant Examiner* — Jerold B Murphy
(74) *Attorney, Agent, or Firm* — CANTOR COLBURN LLP

(57) ABSTRACT

A motor vehicle control case includes an outer shell with several control areas, each of the control areas assigned to a specific function of the vehicle, a printed circuit board supporting elementary sensors to generate an electrical signal in response to an action such as an approach movement, a contact or a pressure exerted by a user by having his fingers on at least one of the control areas. The elementary sensors are connected to an electronic control unit, the electrical signal generated by the elementary sensors being transmitted to the electronic control unit to be analyzed therein and converted into a control of a function of the vehicle. Each elementary sensor includes at least one insulating substrate on which are deposited conductive tracks (Continued)

forming a capacitive sensor and an assembly of conductive or semi-conductive nanoparticles in colloidal suspension in an electrically insulating ligand, the assembly forming a force sensor.

15 Claims, 7 Drawing Sheets

(51) Int. Cl.
| | |
|---|---|
| *G01D 5/24* | (2006.01) |
| *G01L 1/22* | (2006.01) |
| *G06F 3/01* | (2006.01) |
| *G06F 3/041* | (2006.01) |
| *G06F 3/044* | (2006.01) |
| *H03K 17/96* | (2006.01) |
| *B60K 35/25* | (2024.01) |

(52) U.S. Cl.
CPC ........ *G06F 3/0414* (2013.01); *G06F 3/04164* (2019.05); *G06F 3/0447* (2019.05); *H03K 17/962* (2013.01); *B60K 35/10* (2024.01); *B60K 35/25* (2024.01); *B60K 2360/143* (2024.01); *B60K 2360/1438* (2024.01); *B60K 2360/332* (2024.01); *B60K 2360/336* (2024.01); *B60K 2360/34* (2024.01); *G06F 2203/04105* (2013.01)

(56) References Cited

U.S. PATENT DOCUMENTS

| | | | |
|---|---|---|---|
| 2016/0176372 A1* | 6/2016 | Kim | ................... G06F 3/0482 |
| | | | 701/49 |
| 2017/0357344 A1 | 12/2017 | Hong et al. | |
| 2021/0086617 A1* | 3/2021 | Jeon | ...................... B60K 35/10 |

FOREIGN PATENT DOCUMENTS

| | | | | |
|---|---|---|---|---|
| EP | 1978535 A2 * | 10/2008 | ........... | B60N 2/0228 |
| EP | 1978535 B1 | 12/2011 | | |
| EP | 2877911 A1 | 6/2015 | | |
| WO | 2008022872 A1 | 2/2008 | | |

OTHER PUBLICATIONS

European Office Action for European Application No. 21 710 555.0, dated Nov. 14, 2023, 12 pages with translation.

International Search Report issued Jun. 4, 2021 re: Application No. PCT/FR2021/050324, pp. 1-2, citing: EP 1978535 B1, US 2017357344 A1 and US 2015268692 A1.

Chinese Office Action for Application No. 202180017512.7, dated Feb. 27, 2025, 18 pages.

* cited by examiner

CONTROL UNIT FOR A MOTOR VEHICLE

TECHNICAL FIELD

The present disclosure concerns a control case for a motor vehicle intended to control several functions of said vehicle.

BACKGROUND

The passenger compartment of a motor vehicle constitutes for users—driver and any passenger—a place to live and interact with controls which make it possible to monitor functions of the vehicle; these functions are of a very diverse nature and may concern in particular the opening and the closing of the doors of the vehicle, the orientation of the side mirrors, as well as the opening and the closing of the windows fitted to the side doors of the vehicle. The controls that are typically found inside a vehicle and which constitute the interface for monitoring the functions of a vehicle are in particular of the type:
- push buttons, for example, to control the locking of a vehicle,
- rotary knobs, for example, to control the temperature adjustment of the air conditioning system;
- rocker buttons, for example, to control the window opening/closing mechanism
- a trigger, for example, to control the door opening mechanism
- sliders, for example, to control the temperature adjustment of the air conditioning system, The vehicle passenger compartment is therefore equipped with a multitude of control members. These control members-buttons, sliders, etc.—are of the mechanical or electromechanical type. In this regard, these control members are, on the one hand, relatively expensive and, on the other hand, have significant installation constraints in the passenger compartment of the vehicle since they may only be positioned at locations which allow to accommodate their mechanisms. This last constraint therefore greatly reduces the freedom of design of the passenger compartment since the installation of these members is dictated not according to ergonomic considerations but according to mechanical constraints which may be in contradiction with ergonomic considerations.

In this technical context, it has been proposed in document EP 1 978 535 B1 to equip a motor vehicle with a control case gathering several control members. This control case is advantageously installed in an armrest of the door of a vehicle. However, even if the control case described in this prior art makes it possible to reduce the number of control members, its operation requires, on the part of the user, to perform a series of complex operations combining both long presses and short presses with his fingers to be able to execute a particular function. This constraint results from the use of capacitive sensors within the control case which only may detect the duration of a contact on the control members and not the intensity of this contact.

SUMMARY

One of the aims of the disclosure is therefore to provide a control case for a motor vehicle that does not have the drawbacks of the prior art previously described.

To this end, the disclosure concerns a control case for a motor vehicle, comprising:
- an outer shell provided with several control areas, each of the control areas being assigned to a specific function of the motor vehicle,
- a printed circuit board supporting a plurality of elementary sensors configured to generate an electrical signal in response to an action such as an approach movement, a contact or a pressure exerted by a user by means of his fingers on at least one of the control areas, said elementary sensors being connected to an Electronic Control Unit (ECU), the electrical signal generated by the elementary sensors being transmitted to the ECU in order to be analyzed therein and converted into a control of a function of the vehicle, wherein each of the elementary sensors comprises at least one insulating substrate on which are deposited conductive tracks forming a capacitive sensor and an assembly of conductive or semi-conductive nanoparticles in colloidal suspension in an electrically insulating ligand, said assembly forming a force sensor.

Configured in this manner, the control case of the disclosure will make it possible to carry out a large number of operations within a motor vehicle by combining both capacitive sensors, allowing remote or contact detection, and force sensors, making it possible to measure the intensity of a contact on one of the control areas of the control case.

According to other features, the case of the disclosure may include one or several of the following optional features considered alone or in combination;
- at least one of the control areas forms a protrusion on an upper surface of the outer shell on which a users finger can rest, said at least one control area being disposed contiguously to one of the elementary sensors such that pressing said at least one control area generates a deformation of said elementary sensor which may be detected by the force sensor of said elementary sensor.
- the control case further comprises a plurality of lighting devices, each of said lighting devices being capable of emitting a beam of light in the direction of the outer shell at the level of a control area.
- the lighting devices are fastened on the printed circuit board and are disposed under the elementary sensors.
- each lighting device consists of a light-emitting diode and/or a light guide.
- the lighting devices are controlled by the ECU, the ECU being able to vary the beam of light emitted by the lighting devices according to the electrical signals transmitted by the elementary sensors.
- the control areas are of at least two types, namely first control areas, called selection areas, which are intended to select a specific element of the vehicle, and second control areas, called adjustment areas, which are intended to adjust either the position or the state of a specific element of the vehicle previously selected by one of said selection areas.
- the control case comprises four selection areas, called window selection areas, assigned respectively to the selection of a window of the vehicle, respectively a front left window, a front right window, a rear left window and a rear right window, and two adjustment areas, called window adjustment areas, making it possible to displace the window selected by said window selection areas downwards and upwards respectively.
- elementary sensors disposed under the window selection areas are configured to detect the contact of a finger of a user on said window selection areas by means of their capacitive sensor and in that elementary sensors arranged under the window adjustment areas are configured to detect the pressure of a user's finger on said window adjustment areas by means of their force sensor.

the elementary sensors are printed on a film inserted between the outer shell and the lighting devices present on the upper face of the printed circuit board.

the control case comprises two selection areas, called mirror selection areas, assigned respectively to the selection of a mirror of the vehicle, respectively a left side mirror and a right side mirror, and four adjustment areas, called mirror adjustment areas, making it possible to displace the mirror selected by said mirror selection areas respectively to the left, to the right, downwards and upwards elementary sensors disposed under the mirror selection areas and under the mirror adjustment areas are configured to detect the contact of a user's finger respectively on said mirror selection areas and on said mirror adjustment areas by means of their capacitive sensor.

the control case comprises two control areas, called locking/unlocking areas, making it possible to respectively lock and unlock the doors of the vehicle.

the control case comprises at least one elementary sensor configured to detect the presence of a finger of a user near the control case, the ECU being capable, in response to the signal transmitted by said at least one elementary sensor, to switch at least some of the elementary sensors from a deactivated mode, in which they are not sensitive to the actions of a user, to an activated mode, in which they are sensitive to the actions of a user.

the control case comprises at least one elementary sensor configured to detect the contact of a user's finger on a specific control area of the control case by means of its capacitive sensor, the ECU being capable, in response to the signal transmitted by said at least one elementary sensor, to switch some of the elementary sensors from a partially activated mode, in which they can only detect the contact of a finger of a user by means of their capacitive sensor, to a deactivated mode, in which they are not sensitive to the actions of a user, and some other elementary sensors of a deactivated mode, in which they are not sensitive to the actions of a user, to a partially activated mode, in which they may only detect the pressure of a finger of a user by means of their force sensor. The disclosure also concerns a motor vehicle comprising a control case as defined hereinabove.

BRIEF DESCRIPTION OF THE DRAWINGS

The disclosure is described hereinafter according to several preferred embodiments, with no limitation, and with reference to FIGS. 1 to 12 in which.

The drawings are principle representations and are not representative of the scale of the various elements they represent.

DETAILED DESCRIPTION OF THE DRAWINGS

Figure 1:
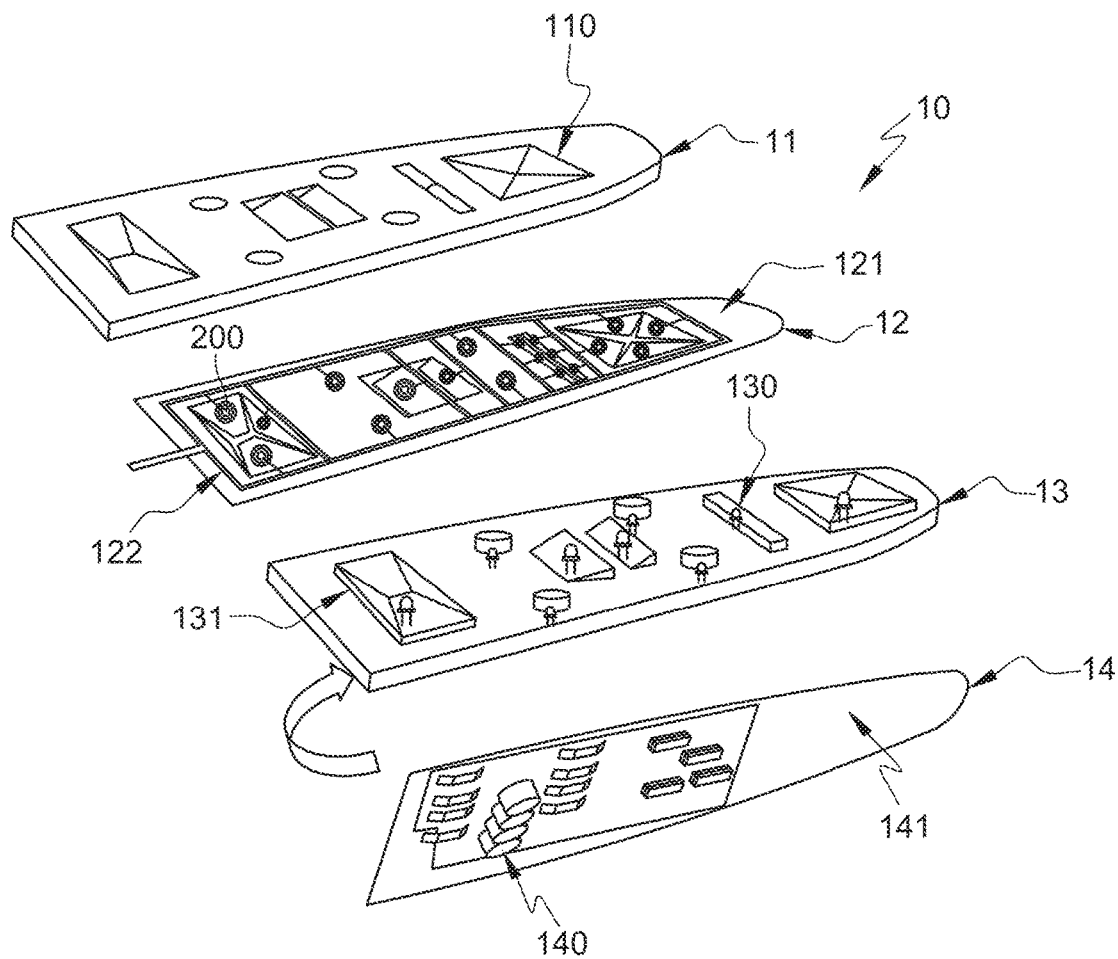
FIG. 1 is an exploded perspective view of a control case according to the disclosure.
Figure 2:
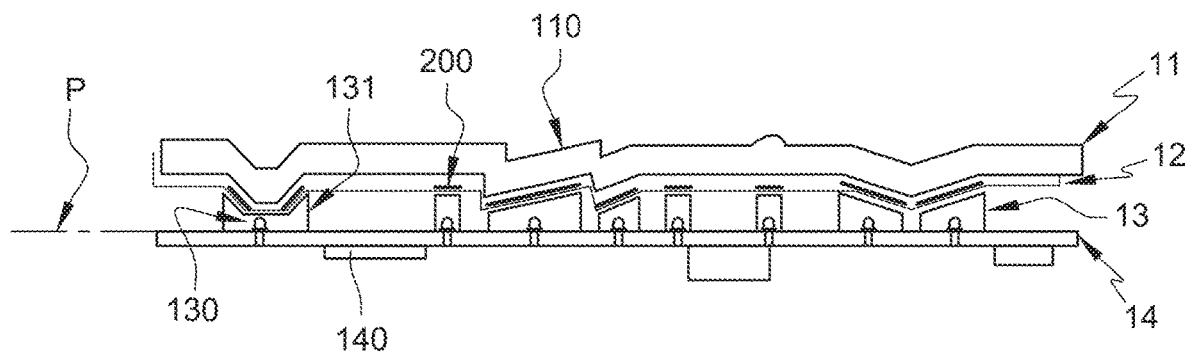
FIG. 2 is a cross-sectional view of the control case of FIG. 1.
Figure 3:
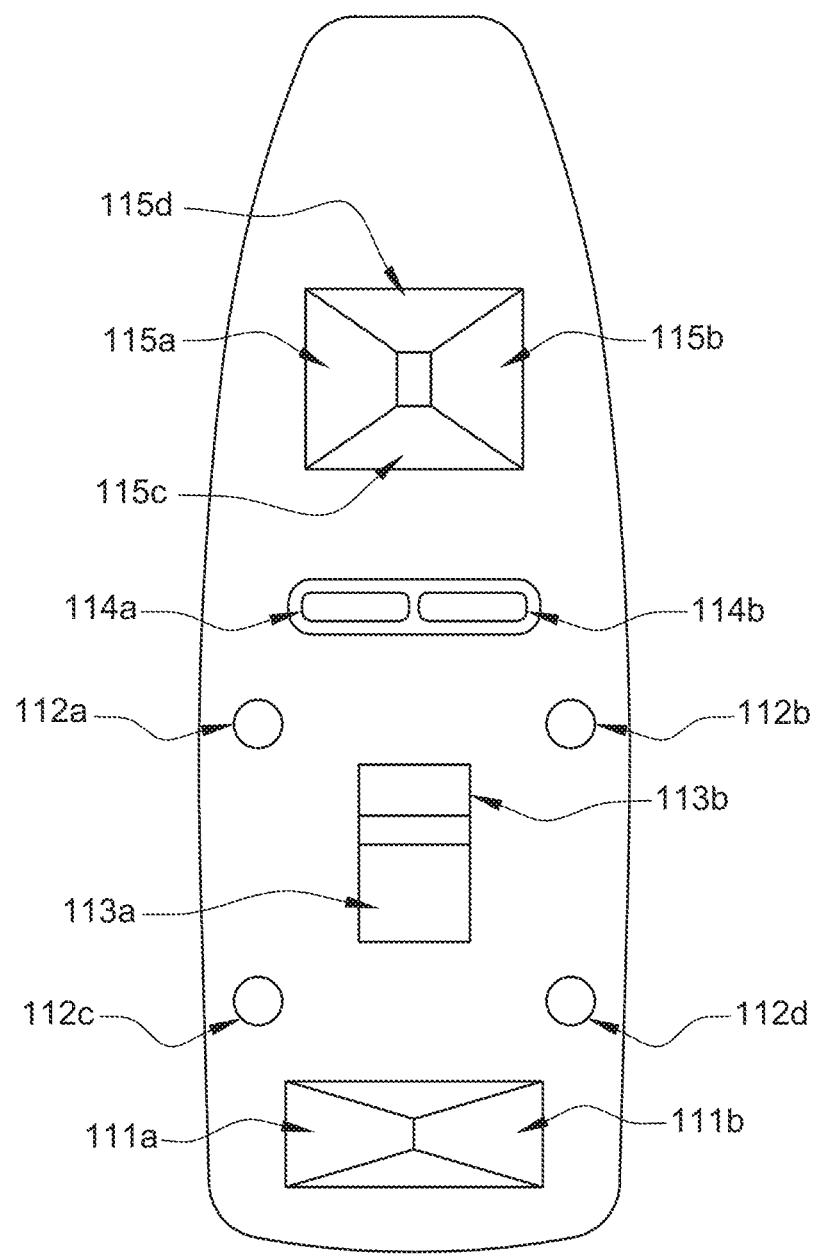
FIG. 3 is a front view of the control case of FIG. 1.

With reference to FIGS. 1 to 3, there is represented an embodiment of a control case according to the disclosure.

In this embodiment, the control case 10 comprises:
  an outer shell 11 provided with several control areas 110, each of the control areas 110 being assigned to a specific function of the motor vehicle,
  a sheet 12 sensitive to touch, supporting a plurality of elementary sensors 200, said sheet 12 being disposed under the outer shell 11 in such a way that each of the elementary sensors 200 is contiguous with one of the control areas 110,
  an intermediate element 13 intended to produce light in the direction of the outer shell, and
  a printed circuit board 14 supporting, on its upper face, the intermediate element 13 and the sheet 12, and, on its lower face, electronic components 140 forming an Electronic Control Unit (ECU).

This control case 10 can be used in particular for opening and closing the side windows, locking and unlocking the doors, as well as for the orientation of the side mirrors. It could, for example, be integrated into the armrest of the driver so that it can be easily operated by him.

The outer shell 11 will advantageously be formed from a thermoplastic material. As illustrated in FIG. 2, the control areas 110 define recesses and/or reliefs on the upper outer surface of the outer shell 11, said recesses and/or reliefs being sized so as to receive a user's finger.

The sheet 12 disposed under the outer shell 11 consists of an insulating support 121 on which conductive tracks 122 are printed, the conductive tracks 122 being electrically connected to the elementary sensors 200 and to the ECU.

The intermediate element 13 comprises a plurality of light-emitting diodes 130 and a plurality of light guides 131. Each light-emitting diode 130 is advantageously aligned, in a direction perpendicular to the plane P defined by the plate 14, with one of the areas 110 of the outer shell 11 and with one of the light guides 131. The light-emitting diodes 130 are also electrically connected to the ECU so that the ECU may control the activation or deactivation of said light-emitting diodes 130 depending on the control area 110 activated by the user. As illustrated in FIG. 2, the light guides 131 advantageously have a profile in relief substantially complementary to that of the control area 110 so as to facilitate the assembly of the control case 10.

The printed circuit board 14 consists in particular of a support 141 on which the electronic components 140 are fastened. This support 141 may be formed of a rigid thermoplastic material.

FIG. 3 represents the distribution of the control areas 110 in the outer shell 11. In order to facilitate the use of the control case 10, each control area 110 advantageously has a specific shape different from that of the other control areas 110, thus allowing a user to easily identify it by touch, without needing to look at the control case 10. Furthermore, in order to optimize the ergonomic design of the control case 10, the control areas 110 have been disposed so as to be easily and quickly operable by the user's fingers. Thus, by moving his fingers in a lower portion of the control case 10, the user will be able to access two control areas 111a, 111b disposed side by side in the direction of the width, each of the control areas 111a, 111b having a substantially trapezoidal shape, the control areas 111a, 111b being inclined with respect to the plane P and forming a recess on the surface of the outer shell 11. By displacing his fingers in a middle portion of the control case 10, the user will be able to access four disk-shaped control areas 112a, 112b, 112c, 112d, the control areas 112a-112d being disposed on the surface of the outer shell 11 so as to define together a square-shaped pattern. The control areas 112a-112d may simply be flush with the surface of the outer shell 11. Two control areas 113a, 113b which are contiguous in the direction of the length are also positioned so as to be inside the square defined by the control areas 112a-112d. As illustrated in FIGS. 1 and 2, each of the control areas 113a, 113b has a rectangular shape and forms a recess on the surface of the outer shell 11. The middle portion of the control case 10 also houses two control areas 114a, 114b of oblong shape and arranged side by side in the direction of the width, the control areas 114a, 114b forming a portion in relief on the surface of the outer shell 11. Finally, by displacing his fingers in an upper portion of the control case 10, the user will be able to access four control areas 115a, 115b, 115c, 115d in the shape of a trapezium, the control areas 115a-115d being inclined with respect to the plane P and forming a recess on the surface of the outer shell 11. The control areas 112a-112d are disposed on the surface of the outer shell 11 so as to define together a pyramid-shaped pattern.

Each control area is assigned in advance to one or more specific functions, said function or functions being carried out as soon as the user activates the control area either by touching it with his finger, or by being sufficiently close to this control area to produce a modification of the electrostatic capacity of the elementary sensors 200, as explained in detail in the following paragraphs. Thus, each of the elementary sensors 200 will advantageously comprise at least one insulating substrate on which are deposited conductive tracks forming a capacitive sensor and an assembly of conductive or semi-conductive nanoparticles in colloidal suspension in an electrically insulating ligand, said assembly forming a force sensor. Such an advantageous configuration will be described, in particular, in detail in the following paragraphs.

The control areas may be classified into at least two types. A first type gathers the areas, called selection areas, which are intended to select a specific element of the vehicle, and a second type gathers the areas, called adjustment areas, which are intended to adjust either the position or the state of a specific element of the vehicle previously selected by one of the selection areas.

Thus, in the embodiment represented in FIG. 3, the control case 10 notably comprises four selection areas, namely the four control areas 112a-112d. The control areas 112a-112d could for example be assigned specifically to the selection of a window of the vehicle, respectively a front left window for the control area 112a, a front right window for the control area 112b, a rear left window for the control area 112c, and a right rear window for the control area 112d. These selection areas 112a-112d, called window selection areas, must first be activated by the user in order to choose the window of the vehicle that the user wishes to raise or lower. Once this choice has been made, the user must actuate one or the other of the control areas 113a, 113b, called window adjustment areas, so as to displace the window selected by said window selection areas 112a-112d downwards and upwards respectively. To this end, the elementary sensors 200 disposed directly under the window selection areas 112a-112d will advantageously be configured to detect the contact of a user's finger on said window selection areas 112a-112d by means of their capacitive sensor. Once this contact has been detected, the ECU will be able to deactivate all of the control areas 110 of the control case 10, apart from those corresponding to the window adjustment areas, namely the control areas 113a and 113b. The user may then act with his finger on one of said window adjustment areas 113a, 113b so as to lower or raise the window previously selected by the window selection areas 112a-112d. To this end, the elementary sensors 200 arranged directly under the window adjustment areas 113a, 113b will advantageously be configured to detect the pressure of a user's finger on said window adjustment areas 113a, 113b by means of their force sensor.

The control case 10 represented in FIG. 3 also comprises two other selection areas, namely the control areas 114a and 114b, which may be assigned respectively to the selection of a vehicle mirror, respectively a left side mirror for the control area 114a and a right side mirror for the control area 114b. These selection areas 114a, 114b, called mirror selection areas, must first be activated by the user so as to choose the mirror of the vehicle that the user wishes to displace. Once this choice has been made, the user must actuate one or the other of the control areas 115a-115d, called mirror adjustment areas, so as to displace the mirror selected by said mirror selection areas 114a, 114b to the left by means of the area 115a, to the right by means of the area 115b, downwards by means of the area 115c and upwards by means of the area 115d. To this end, the elementary sensors 200 disposed directly under the mirror selection areas 114a, 114b will advantageously be configured to detect the contact of a finger of a user on said mirror selection areas 114a, 114b by means of their capacitive sensor. Once this contact has been detected, the ECU will be able to deactivate all of the control areas 110 of the control case 10, apart from those corresponding to the mirror adjustment areas, namely the control areas 115a-115d. The user may then act with his finger on one of said mirror adjustment areas 115a-115d so as to displace the mirror previously selected by the mirror selection areas 114a 114b, either to the left or to the right, either downwards or upwards. To this end, the elementary sensors 200 disposed directly under the mirror adjustment areas 115a-115d will advantageously be configured to detect the contact of a finger of a user on said mirror adjustment areas 115a-115d by means of their capacitive sensor.

The control case 10 represented in FIG. 3 also comprises two control areas 111a and 111b, called locking/unlocking areas, making it possible respectively to lock and unlock the doors of the vehicle. To this end, the elementary sensors 200 arranged directly under the locking/unlocking areas 111a, 111b will advantageously be configured to detect the contact of a finger of a user on said locking/unlocking areas by means of their capacitive sensor.

In general, the control case 10 of the disclosure may comprise a larger or smaller number of control areas 110 than that represented in FIG. 3. In addition, the distribution, the shape of the control areas 110 and their assigned functions may differ from those previously described.

All the possible variants of the control case 10 of the disclosure will preferably operate on the principle of selective activation/deactivation of some control areas 110 by the ECU according to the signals received by the ECU from elementary sensors 200. The control area(s) 110 which are activated by the ECU may advantageously be backlit by means of the light-emitting diode(s) 130 and the associated light guides 131 which are located directly under the control areas 110, thus allowing the user to know which control area(s) 110 has actually been activated by the ECU.

The control case 10 of the disclosure will preferably comprise at least one specific elementary sensor 200 configured to detect the presence of a finger of a user near the control case, the ECU being capable, in response to the signal transmitted by said at least one specific elementary sensor 200, to switch at least some of the elementary sensors 200 from a deactivated mode, in which they are not sensitive to the actions of a user, to an activated mode, in which they are sensitive to the actions of a user. In a possible variant of the disclosure, this detection will be done by means of the capacitive sensor of said at least one specific elementary sensor 200. In another possible variant of the disclosure, all of the elementary sensors 200 of the control case 10, apart from the specific elementary sensor, may initially be in a deactivated mode, in which they are not sensitive to the actions of a user, and, following the activation of the specific elementary sensor, the ECU will be able to switch some of the elementary sensors 200 of the control case 10 from this deactivated mode to a fully activated mode, in which they are sensitive to the actions of a user both remotely or on contact, or partially activated, in which they are sensitive only to the user's touch.

In a complementary manner, the control case 10 may also comprise at least one specific elementary sensor 200 configured to detect the contact of a finger of a user on a specific control area 110 of the control case by means of its capacitive sensor, The ECU being able, in response to the signal transmitted by said at least one specific elementary sensor 200, to switch some of the elementary sensors 200 from a partially activated mode, in which they may only detect the contact of a finger of a user by means of their capacitive sensor, to a deactivated mode, in which they are not sensitive to the actions of a user, and some other elementary sensors 200 from a deactivated mode, in which they are not sensitive to the actions of a user, to a partially activated mode, in which they may only detect the pressure of a user's finger by means of their force sensor.

Thus, in the particular embodiment represented in FIG. 3, the window selection areas 112a-112d and the mirror selection areas 114a, 114b may initially be in a partially activated mode, in which they will be able to detect the contact of a user's finger by means of their capacitive sensor 221, 222, while the window adjustment areas 113a, 113b and the mirror adjustment areas 115a-115d will initially be deactivated. Therefore, when the user activates one of the selection areas with his finger, the ECU will produce, in response to the signal received from the elementary sensor 200 corresponding to the area pressed by the user, a deactivation of all the selection areas 112a-112d and 114a, 114b and a partial activation of the adjustment areas 113a, 113b, in the case where the area pressed by the user is one of the areas 112a 112d, or of the adjustment areas 115a-115d, in the case where the area pressed by the user is one of the areas 114a, 114b. In this partially activated mode, the window adjustment areas 113a, 113b will only be sensitive to the pressure exerted by the user's finger, the pressure being able to be measured by means of the force sensors 230 of the elementary sensors 200 which are positioned just below the window adjustment areas 113a, 113b, and the mirror adjustment areas 115a-115d will only be sensitive to the contact of a finger of the user, this contact being able to be detected by means of the capacitive sensors 221, 222 of the of the elementary sensors 200 which are positioned just below the mirror adjustment areas 115a-115d. The pressure or the contact detected by the force sensors 230 or the capacitive sensors 221, 222 will then be communicated to the ECU in the form of an electrical signal, the ECU being capable of monitoring the displacement of the window or the mirror previously selected by the user by means of the selection areas according to the electrical signals received from said force sensors or from said capacitive sensors. Thus, a larger or smaller pressure on the window adjustment areas 113a, 113b will thus produce a more or less significant displacement of the window.

Figure 12:
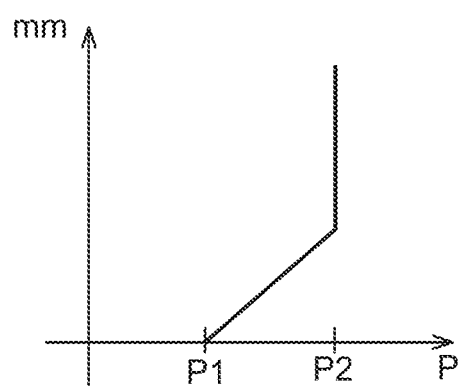
FIG. 12 shows a displacement curve of a window of a vehicle in response to a pressure exerted on an elementary sensor that can be used in the context of the disclosure.

With reference to FIG. 12, there is represented an example of a displacement curve of a window of a vehicle in response to a pressure exerted on an elementary sensor 200 that can be used within the context of the disclosure. In this example, there is no displacement of the window if the user presses on one of the adjustment area 113a, 113b with a pressure lower than a first threshold value P1. If the user presses more strongly on the adjustment area 113a, 113b such that the pressure exerted is greater than the first threshold value P1 while being less than a second threshold value P2, the window moves progressively until it reaches its lowest or highest extreme position. In the case where the user strongly presses on the adjustment area 113a, 113b such that the pressure exerted is greater than the second threshold value P2, the window moves rapidly towards its lowest or highest extreme position.

Figure 4:
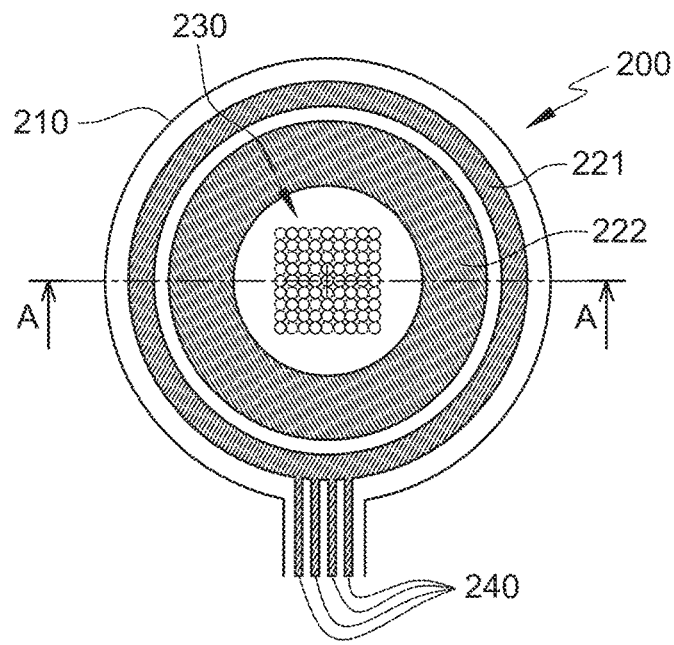
FIG. 4 is a top view, according to a first embodiment, of an elementary sensor able to be used in the context of the disclosure.

FIG. 4 represents an exemplary embodiment of an elementary sensor 200 that could be used in the control case of the disclosure. This elementary sensor 200 comprises an insulating substrate 210 on which are deposited, by techniques known from the prior art, concentric conductive tracks 221, 222 constituting a capacitive sensor.

The insulating substrate 210 is, according to exemplary embodiments, a polymer, for example a polyimide or a PET, or a ceramic.

Said concentric tracks 221, 222 are for example made of copper, of ITO ($In_2O_3$—$SnO_2$) to produce a transparent sensor or of any other conductive material.

They are deposited, for example, by photolithography or by soft lithography.

An assembly of nanoparticles constituting a force sensor is deposited in the center of the sensor.

According to an exemplary embodiment, suitable for producing a transparent sensor, said nanoparticles are ITO nanoparticles in colloidal suspension in an insulating ligand, for example an (aminomethyl) phosphonic acid ($CH_6NO_3P$).

According to other exemplary embodiments, the nanoparticles are zinc oxide (ZnO) nanoparticles or gold (Au) nanoparticles.

The assembly of nanoparticles 230 is a monolayer or multilayer assembly, deposited on the substrate, for example, by convective capillary deposition or by a so-called "drop evaporation" method as described in the document EP 2 877 911, without these examples are neither exhaustive nor limiting.

The assembly of nanoparticles 230 is firmly related to the substrate 210, for example through a chemical coupler.

For example, the chemical coupler is silane ($SiH_4$), capable of interacting with OH groups on the surface of the substrate previously activated by UV Ozone treatment and including at the other end of the coupler a carboxylic group (COOH) capable of being grafted onto an amine group (NH2) previously grafted to the surface of the nanoparticles.

The assembly of nanoparticles 230 constitutes a strain gauge, the electrical conductivity of which varies according to the relative distance between the nanoparticles of the assembly.

This variation of conductivity or vice versa of electrical resistance is attributed to the conduction by tunnel effect between the nanoparticles, and this effect provides a very high gauge factor, much higher than what is possible to obtain with a piezoresistive film, which makes it possible to measure very small deformations.

For example, the proportional variation of the resistance of such an elementary force sensor, consisting of an assembly of ITO nanoparticles in a ligand based on phosphonic acid, shows an exponential evolution of the response as a function of the deformation undergone by said elementary sensor, with a gauge factor reaching the value of 85 over a deformation range from −1%, in compression, to +1% in tension for a resistance of the order of $2000 \cdot 10^3$ Ohm in the absence of deformation.

Thus this elementary force sensor is very sensitive and makes it possible to detect a pressing or touch force, even relatively weak, applied to said sensor, which can thus constitute its own test body. In other words, the deformation of the substrate is not required to detect an applied effort and the arrangement represented in FIG. 4 may be produced on a rigid substrate such as silicon dioxide ($SiO_2$) or silicon nitride ($Si_3N_4$) while allowing a measurement of the force applied to the sensor.

Figure 11:
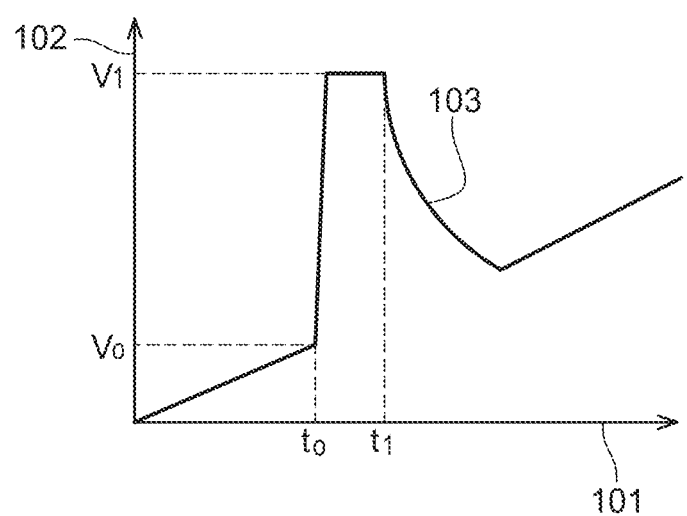
FIG. 11 shows the variation of the voltage delivered as a function of time by a force sensor implementing an assembly of nanoparticles whose conductivity varies according to the force applied to said sensor.

With reference to FIG. 11, there is represented an example of variation of the voltage 102 delivered as a function of time 101 by such an elementary force sensor when a force is applied to said sensor, for example a touch. According to this example, the touch is applied between times $t_0$ and $t_1$. The intensity of the force is proportional to the difference $V_1-V_0$, in which the value $V_1$ is measurable and the value $V_0$ depends on environmental factors and is likely to vary over time, in particular with temperature.

Conductive tracks 240, represented herein according to a principle representation, also deposited on the substrate 210, allow the supply of power and the collection of data from the capacitive sensor and from the force sensor.

Figure 5:
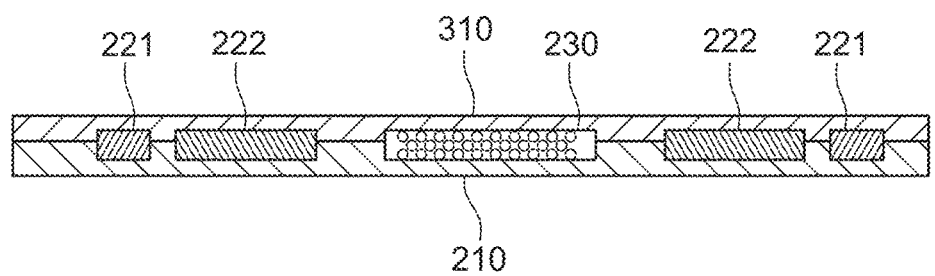
FIG. 5 is a sectional view along section line AA of the sensor of FIG. 4.

According to a first embodiment represented in FIG. 5, a protective layer 310 consists of an insulating material, for example a polyimide, or a PET for the production of a transparent sensor, and is deposited on the sensor thus created.

According to this first embodiment, the combined elementary sensor 200 has a diameter comprised between 10 mm and 30 mm and a thickness comprised between 50 μm and 300 μm without these values being limiting.

According to a second embodiment represented in FIG. 6, the combined elementary sensor 200 is produced in 2 layers 401, 402, the first layer 401 comprising, according to this second embodiment, a substrate $201_1$ on which is deposited the force sensor 230 according to a technology identical to what has been explained hereinabove, and a protection layer $310_1$, and superimposed on this first layer 401, a second layer 402 comprising a substrate $210_2$ on which are deposited the conductive tracks 221, 222 forming the capacitive sensor.

A protection layer $310_2$ is placed on said capacitive sensor.

Figure 7A:
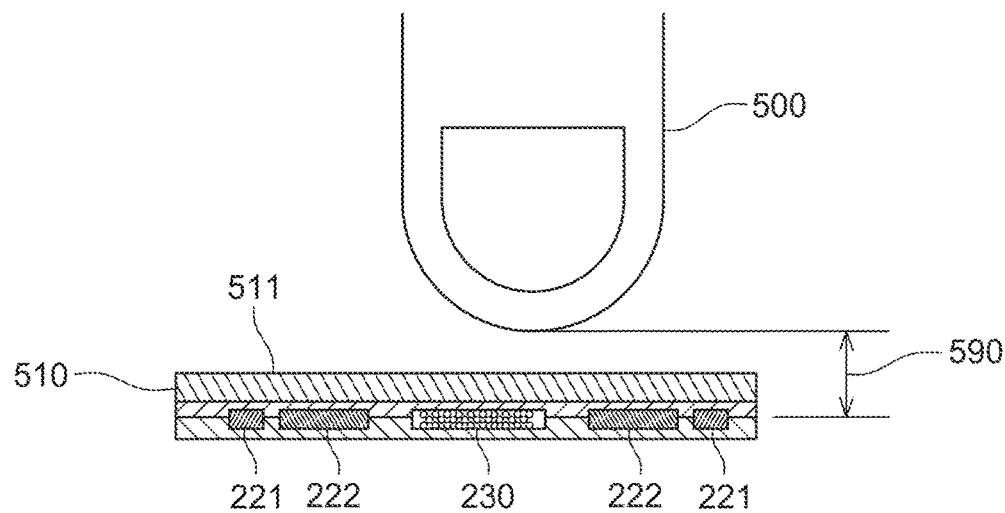
FIG. 7A is a sectional view of an elementary sensor according to another embodiment during proximity detection.
Figure 7B:
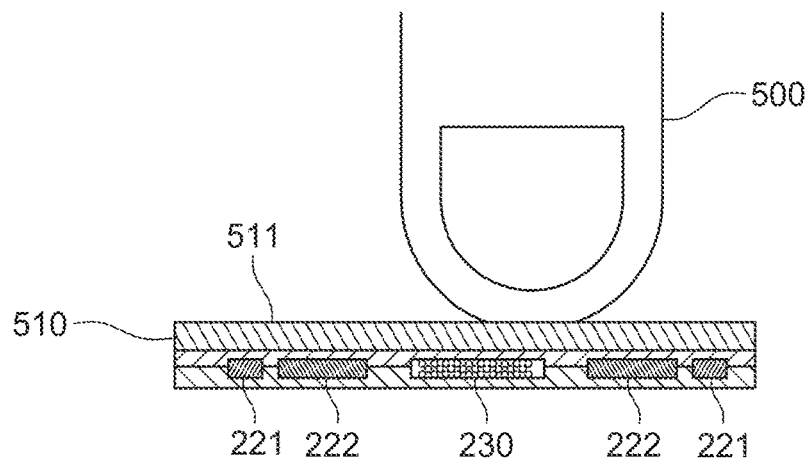
FIG. 7B is a view similar to FIG. 7A when detecting a touch.

According to an example of implementation represented in FIGS. 7A and 7B, the elementary sensor 200 is attached to one face of an insulating substrate 510, the opposite face 511 of said substrate being exposed to the touch.

Thus, the surface 511 of this substrate 510 is functionalized and makes it possible to detect a touch on this surface and to measure the force of application of this touch.

According to non-limiting examples of embodiment, said substrate 510 may consist of a polymer, glass, ceramic, leather or wood. The sensitivity of the force sensor makes it possible to detect a slight deformation, and thus to detect and measure a touch force even if this substrate is relatively rigid.

As illustrated in FIG. 7A, when an electrically conductive object, for example a finger 500, is approached to the surface 511 thus functionalized, at a time to, its presence is detected, even before there is contact, as soon as the latter is at a distance less than or equal to a minimum distance 590 from the capacitive sensor.

This minimum distance 590 is adjustable according to the characteristics of the sensor and a threshold defined on the signal delivered by said capacitive sensor.

As an example, the minimum distance is selected at any value comprised between 0 and 10 mm depending on the intended application.

To this end, the sensor is connected to an electronic circuit capable of carrying out these functions as well as the steps of the method described hereinafter.

Figure 7C:
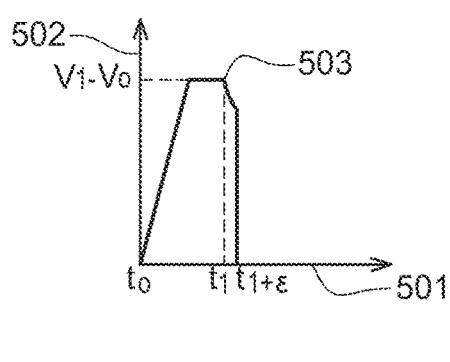
FIG. 7C represents the time evolution of the signal from the force sensor formed by the elementary sensor of FIGS. 7A and 7B.
Figure 7D:
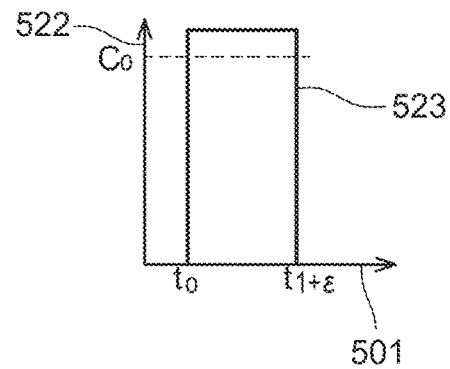
FIG. 7D represents the time evolution of the signal from the capacitive sensor formed by the elementary sensor of FIGS. 7A and 7B.

Thus, at time $t_0$, as shown in FIG. 7D, by observing the value of the signal 522 delivered by the capacitive sensor as a function of time 501, the item of information 523 delivered by said sensor crosses a threshold $C_0$ corresponding to the crossing of the minimum distance 590. Then, as soon as the object 500 comes into contact with the surface, the item of information delivered by the capacitive sensor changes no more or very little, even if the applied pressure increases.

Returning to FIG. 11, when the proximity of the object 500 is detected, the value $V_0$ delivered by the force sensor at time to is measured and taken as the reference value, by making this value correspond to a force equal to 0, since there is no contact, as shown in FIG. 7C, which represents the value 502 of the signal 503 delivered by the force sensor as a function of time 501, modified by the processing.

Thus, any drift phenomenon of the item of information delivered by the force sensor, in particular due to temperature variations, is compensated.

As shown in FIG. 7B, when the object 500 comes into contact with the functionalized surface 511 and applies a touch force thereon, the conductivity of the force sensor is modified proportionally to the applied force, and it delivers, as illustrated in FIG. 7C, an item of information $V_1$ corresponding to a force proportional to $V_1-V_0$, corrected by the initial drift value $V_0$ of the force sensor 230.

When the touch pressure is released at time $t_1$, at a short instant $(t_1+e)$ following this release, the object 500 is at a distance from the surface 511 greater than or equal to the minimum distance 590, and, as illustrated in FIG. 7D, the item of information delivered by the capacitive sensor crosses the threshold $C_0$ in the opposite direction.

When the crossing of this threshold $C_0$ is detected on the capacitive sensor, the item of information delivered by the force sensor is considered equal to 0. Thus, the delayed return to 0 of the item of information delivered by the force sensor, due to the hysteresis phenomena, is also masked.

Thus, the combined use of the force sensor and the capacitive sensor makes it possible to measure an applied force, and if necessary to trigger actions according to the level of this force, by overcoming the phenomena of inherent drift and hysteresis at this type of force sensor and as represented in FIG. 11.

Figure 6:
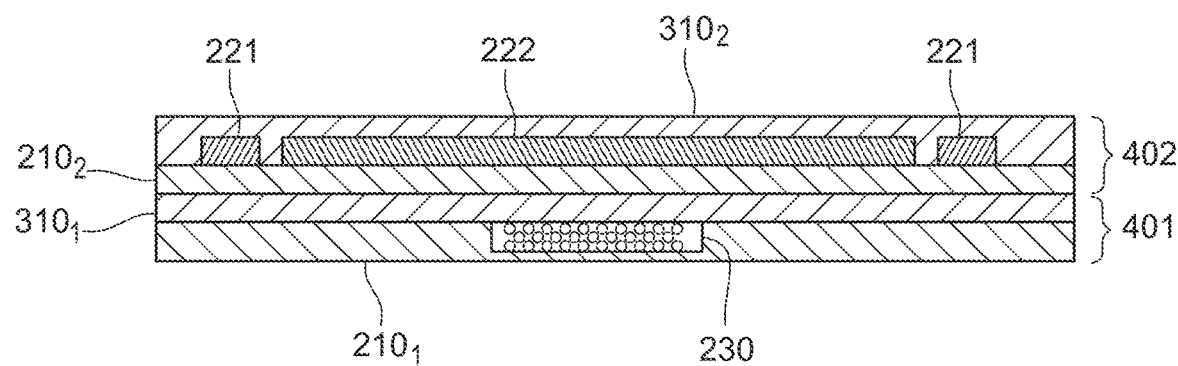
FIG. 6 is a view similar to FIG. 5 but according to a second embodiment of an elementary sensor able to be used within the context of the disclosure.

FIGS. 7A and 7B represent a combined sensor according to the first embodiment represented in FIG. 5, those skilled in the art understand that the same principles are applicable in the case of a combined sensor corresponding to the second embodiment represented in FIG. 6.

Figure 8:
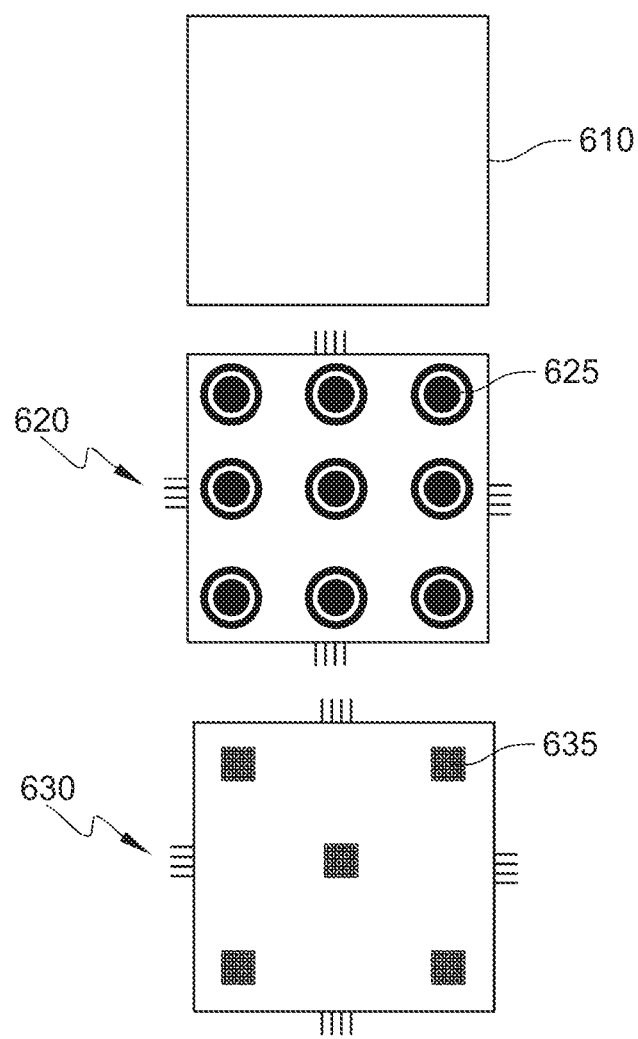
FIG. 8 represents, in an exploded top view, an exemplary embodiment of a touch-sensitive surface combining a plurality of elementary sensors that can be used in the context of the disclosure.

With reference to FIG. 8, a plurality of elementary sensors 200 are associated in a grid so as to form a touch-sensitive surface capable of detecting a touch, its location on the grid and the exerted pressure effort.

FIG. 8 represents an embodiment combining a plurality of sensors according to the embodiment represented in FIG. 6. Those skilled in the art will be able to adapt this principle to the embodiment of the elementary sensor 200 represented in FIG. 5.

Said touch-sensitive surface comprises a substrate 610, made of an electrically insulating material, and including a surface exposed to the touch.

On the face opposite to this surface exposed to the touch of the substrate 610 is attached a first layer 620 comprising a grid of capacitive sensors 625, such as the upper layer 402 of FIG. 6.

Under the layer 620 carrying the grid of capacitive sensors is attached a layer 630 comprising a grid of force sensors 635 consisting of assemblies of nanoparticles, such as the lower layer 401 of FIG. 6.

According to a first exemplary embodiment (not represented), the number of force sensors 635 is equal to the number of capacitive sensors 625 and said force sensors are located centered with respect to the capacitive sensors.

Advantageously, the number of force sensors 635 is reduced relative to the number of capacitive sensors 625 and said force sensors are located centered, or not, relative to said capacitive sensors.

This embodiment, using a reduced number of force sensors is more economical.

Indeed, whatever the point of application of the touch force on the touch-sensitive surface thus created, the touch effort is evaluated, knowing this point of application, and deduced from the signals delivered by one of the force sensors, for example that closest to the point of application, or by combining the information delivered by several of these sensors, at least 3 force sensors for a flat touch-sensitive surface, according to implementation variants.

The location of the point of application of the touch on the touch-sensitive surface is obtained from the grid of capacitive sensors 625.

This principle remains valid in the case of multiple touch points.

This embodiment makes it possible to produce a touch-sensitive surface comprising a high density of capacitive sensors, more economical to produce than the force sensors, and thus to obtain precise localization of the point(s) of application of the touch, then to evaluate the force applied during these touches by appropriate processing of the information delivered by a reduced number of force sensors 635 of more costly construction, depending on the location of the point(s) of application of the touch.

The method implemented remains the same, namely that as soon as the proximity of a conductive object is detected at a distance less than or equal to the minimum distance 590 from one of the capacitive sensors, the value $V_0$ delivered by each of the force sensors is measured so as to readjust the item of information delivered by each of said sensors, the application effort is determined by combining the information from said force sensors as a function of the location of the point of application of the effort given by the network capacitive sensors, then, when the object moves away from the touch-sensitive surface by a distance greater than or equal to the minimum distance, the effort is reset to 0.

The person skilled in the art understands that the use of a reduced number of force sensors compared to the number of capacitive sensors is applicable to a touch-sensitive surface of shape other than flat, for example a surface with a single or double curvature, as long as this form is stable.

For a flexible touch-sensitive surface of variable shape, for example a touch-sensitive surface applied to a clothing, the embodiment comprising a number of force sensors equivalent to that of the capacitive sensors and centered in relation to the latter is preferable.

Thus, the device as previously described offers in its variants very varied application possibilities.

Figure 9:
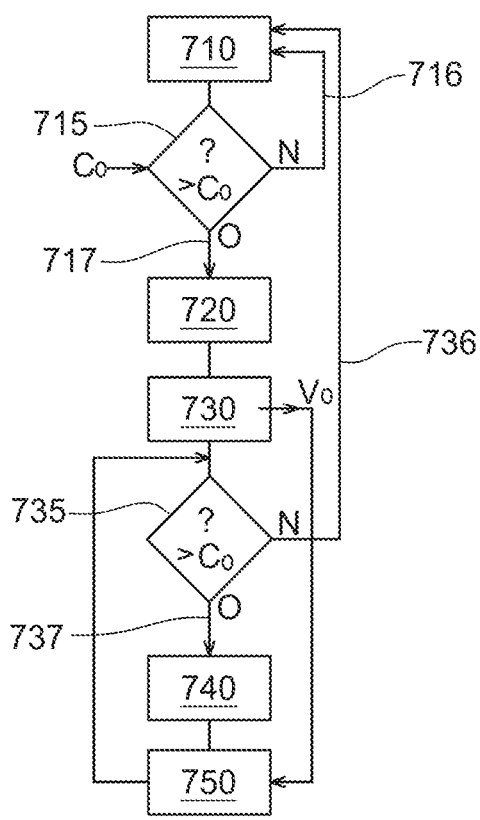
FIG. 9 shows the flowchart of an example of method implementing an elementary sensor that can be used in the context of the disclosure.

As illustrated in FIG. 9, the implementation of a method for detecting and measuring the intensity of a touch force by an electrically conductive object 500 on a touch-sensitive surface comprising an elementary sensor 200 as described hereinabove, whatever its embodiment, comprises, according to a defined frequency or time interval, the reading 710 of the signal from the capacitive sensor and the comparison 715 of the value of the signal thus read with a defined value $C_0$ representative of a minimum distance between an object and the capacitive sensor.

According to this exemplary embodiment, and with reference to FIGS. 7A and 7D, when this distance is less than or equal to a minimum distance, the signal delivered by the capacitive sensor is greater than or equal to a value $C_0$.

In the case 716 where the signal delivered by the capacitive sensor remains lower than $C_0$, no other action is triggered and the scanning of the signal at the given frequency or by given time interval continues.

In the case 717 where the signal delivered by the capacitive sensor crosses the threshold $C_0$ and therefore an object is close to said sensor, during initialization steps of the force sensor, the value delivered by the force sensor is read 720 and during a drift determination step 730 the value $V_0$ thus read is used as a reference value.

The effort applied is measured against this reference as long as the object is in contact with the touch-sensitive surface. To this end, the signal output from the capacitive sensor is compared 735 to the value $C_0$ corresponding to the minimum distance, and as long as 737 the value delivered by this sensor remains greater than the value $C_0$, the signal from the force sensor is measured 740 and, during a resetting step 750, reset with respect to the value $V_0$ determined during the drift determination step 730 carried out in the same acquisition sequence.

The method described in FIG. 9 in the case of an elementary sensor 200, extends to the case of a touch-sensitive surface comprising as many elementary sensors, with additional steps consisting in locating on the grid of capacitive sensors the one where the proximity is detected, and as a function of this item of information, applying the steps of reading the delivered item of information 720, of measuring the drift 730, of measuring the applied force 740 and of resetting 750 to the force sensor which is the closest to the capacitive sensor for which proximity to touch is detected.

Figure 10:
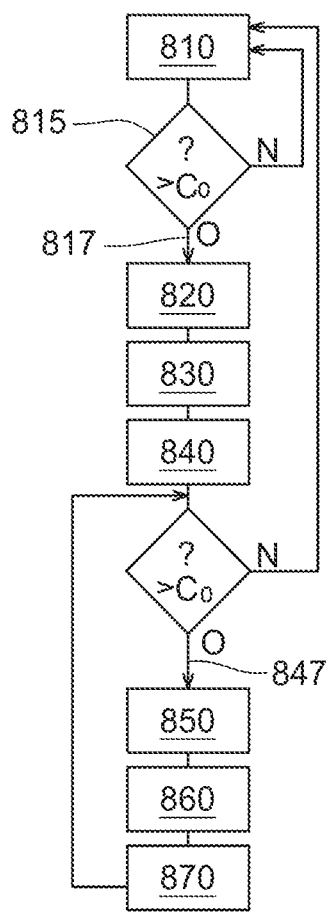
FIG. 10 is an example of a flowchart of a method implementing a touch-sensitive surface integrating an elementary sensor that can be used in the context of the disclosure.

As illustrated in FIG. 10, in the case where the touch-sensitive surface comprises a significantly greater density of capacitive sensors compared to the number of force sensors, during a step 810 of scanning, the information delivered by the capacitive sensors is probed at regular time intervals and the item of information delivered by each sensor is compared 815 with that, $C_0$, corresponding to the minimum distance threshold.

When this threshold is exceeded 817 on one of the sensors, during a location step 820, the position of the activated capacitive sensor is determined.

During a drift determination step 830 the item of information delivered by each of the force sensors is read and this item of information is assigned 840 to each of the respective force sensors as a resetting value.

Throughout the touch 847, the item of information from the force sensors is acquired 850, reset 860 for each sensor by the value evaluated during the drift determination step 830.

Then, depending on the point of application of the effort, determined during the location step 820, the effort applied to the considered point is estimated 870 by combining the item of information from the force sensors.

The invention claimed is:

1. A control case for a motor vehicle, comprising:
   an outer shell provided with several control areas, each of the control areas being assigned to a specific function of the motor vehicle;
   a printed circuit board supporting a plurality of elementary sensors configured to generate an electrical signal in response to an action such as an approach movement, a contact or a pressure exerted by a user by having fingers on at least one of the control areas, said elementary sensors being connected to an electronic control unit, the electric signal generated by the elementary sensors being transmitted to the electronic control unit in order to be analyzed therein and converted into a control of a function of the vehicle,
   wherein each of the elementary sensors comprises at least one insulating substrate on which are deposited conductive tracks forming a capacitive sensor and an assembly of conductive or semi-conductive nanoparticles in colloidal suspension in an electrically insulating ligand, said assembly forming a force sensor; and
   at least one elementary sensor configured to detect the contact of a finger of a user on a control area specific to the control case by its capacitive sensor, the electronic control unit being capable, in response to the signal transmitted by said at least one elementary sensor, to switch some of the elementary sensors from a partially activated mode, in which they can only detect the contact of a finger of a user by means of their capacitive sensor, to a deactivated mode, in which they are not sensitive to the actions of a user, and some other elementary sensors from a deactivated mode, in which they are not sensitive to the actions of a user, to a partially activated mode, in which they may only detect the pressure of a finger from a user by means of their force sensor.

2. The control case according to claim 1, wherein at least one of the control areas forms a protuberance, or a recess, on an upper surface of the outer shell on which a user's finger can press, said at least one control area being disposed contiguously with one of the elementary sensors such that pressing said at least one control area generates a deformation of said elementary sensor which may be detected by the force sensor of said elementary sensor.

3. The control case according to claim 1, further comprising a plurality of lighting devices, each of said lighting devices being capable of emitting a beam of light in the direction of the outer shell at the level of a control area.

4. The control case according to claim 3, wherein the lighting devices are fastened on the printed circuit board and are disposed under the elementary sensors.

5. The control case according to claim 3, wherein each lighting device includes a light emitting diode and/or a light guide.

6. The control case according to claim 3, wherein the lighting devices are controlled by the electronic control unit, the electronic control unit being able to vary the beam of light emitted by the lighting devices according to the electrical signals transmitted by the elementary sensors.

7. The control case according to claim 1, wherein the control areas are at least of two types, first control areas, called selection areas, which are intended to select a specific element of the vehicle, and second control areas, called adjustment areas, which are intended to adjust either the position or the state of a specific element of the vehicle previously selected by one of said selection areas.

8. The control case according to claim 7, further comprising four selection areas, called window selection areas, respectively assigned to the selection of a vehicle window, respectively a left front window, a right front window, a left rear window, and a right rear window, and two adjustment areas, called window adjustment areas, configured to displace the window selected by said window selection areas downwards and upwards respectively.

9. The control case according to claim 8, wherein the elementary sensors disposed under the window selection areas are configured to detect the contact of a finger of a user on said window selection areas by their capacitive sensor and in that the elementary sensors disposed under the window adjustment areas are configured to detect the pressure of a user's finger on said window adjustment areas by means of their force sensor.

10. The control case according to claim 7, wherein the elementary sensors are printed on a film inserted between the outer shell and the lighting devices present on the upper side of the printed circuit board.

11. The control case according to claim 7, further comprises two selection areas, called mirror selection areas, respectively assigned to the selection of a mirror of the vehicle, respectively a left side mirror and a right side mirror, and four adjustment areas, called mirror adjustment areas, configured to displace the mirror selected by said mirror selection areas respectively to the left, to the right, downwards and upwards.

12. The control case according to claim 11, wherein elementary sensors disposed under the mirror selection areas and under the mirror adjustment areas are configured to detect the contact of a finger of a user respectively on said mirror selection areas and on said mirror adjustment areas by their capacitive sensor.

13. The control case according to claim 1, further comprising two control areas, called locking/unlocking areas, configured to respectively lock and unlock the doors of the vehicle.

14. The control case according to claim 1, further comprises at least one elementary sensor configured to detect the presence of a finger of a user near the control case by its capacitive sensor, the electronic control unit being capable, in response to the signal transmitted by said at least one elementary sensor, of switching at least some of the elementary sensors from a deactivated mode, in which the elementary sensors are not sensitive to the actions of a user, to an activated mode, in which the elementary sensors are sensitive to the actions of a user.

15. A motor vehicle comprising a control case according to claim 1.

* * * * *